(12) United States Patent
Lee et al.

(10) Patent No.: US 11,864,394 B2
(45) Date of Patent: Jan. 2, 2024

(54) SEMICONDUCTOR DEVICE (71) Applicant: SK hynix Inc., Icheon (KR)

(72) Inventors: Beom Seok Lee, Icheon (KR); Won Jun Lee, Icheon (KR); Seok Man Hong, Icheon (KR)

(73) Assignee: SK hynix Inc., Icheon (KR)

( * ) Notice: Subject to any disclaimer, the term of this patent is extended or adjusted under 35 U.S.C. 154(b) by 185 days.

(21) Appl. No.: 17/494,534

(22) Filed: Oct. 5, 2021

(65) Prior Publication Data

US 2022/0328563 A1 Oct. 13, 2022

(30) Foreign Application Priority Data

Apr. 8, 2021 (KR) .......................... 10-2021-0046126

(51) Int. Cl.
*G11C 11/00* (2006.01)
*H10B 63/00* (2023.01)
*G11C 13/00* (2006.01)
*H10N 70/20* (2023.01)

(52) U.S. Cl.
CPC ........... *H10B 63/84* (2023.02); *G11C 13/004* (2013.01); *G11C 13/0004* (2013.01); *G11C 13/0069* (2013.01); *H10N 70/231* (2023.02); *G11C 2213/71* (2013.01)

(58) Field of Classification Search
CPC .............. G11C 13/0004; G11C 13/004; G11C 13/0069

USPC ......................................................... 365/163
See application file for complete search history.

(56) References Cited

U.S. PATENT DOCUMENTS

| | | | |
|---|---|---|---|
| 9,287,498 B2 | 3/2016 | Kau | |
| 10,157,667 B2 | 12/2018 | Redaelli et al. | |
| 10,193,064 B2 | 1/2019 | Chan et al. | |
| 2011/0210303 A1* | 9/2011 | Muraoka | H01L 27/101 257/E47.001 |
| 2019/0067571 A1* | 2/2019 | Fratin | H10B 63/845 |
| 2019/0311760 A1* | 10/2019 | Meade | H10N 70/24 |
| 2021/0064455 A1* | 3/2021 | Akel | G06F 11/1064 |

* cited by examiner

*Primary Examiner* — Vu A Le (57) ABSTRACT

A semiconductor device may include first row lines each extending in a first direction, column lines each extending in a second direction crossing the first direction, second row lines each extending in the first direction, a plurality of first memory cells respectively coupled between the first row lines and the column lines, each of the plurality of first memory cells including a first variable resistance layer and a first dielectric layer positioned between the first variable resistance layer and a corresponding one of the first row lines, and a plurality of second memory cells respectively coupled between the second row lines and the column lines, each of the plurality of second memory cells including a second variable resistance layer and a second dielectric layer positioned between the second variable resistance layer and a corresponding one of the second row lines.

16 Claims, 10 Drawing Sheets

SEMICONDUCTOR DEVICE

CROSS-REFERENCE TO RELATED APPLICATION

The present application claims priority under 35 U.S.C. § 119(a) to Korean patent application number 10-2021-0046126 filed on Apr. 8, 2021, in the Korean Intellectual Property Office, the entire disclosure of which is incorporated by reference herein.

BACKGROUND

1. Field of Invention

The present disclosure relates to an electronic device, and more particularly, to a semiconductor device.

2. Description of Related Art

In recent years, a semiconductor device capable of storing information in various electronic devices such as a computer and a portable communication device has been demanded, according to miniaturization, low power consumption, high performance, and diversification of an electronic device. Therefore, study on a semiconductor device capable of storing data by using a switching characteristic between different resistance states according to an applied voltage or current. Examples of such a semiconductor device include a resistive random access memory (RRAM), a phase-change random access memory (PRAM), a ferroelectric random access memory (FRAM), a magnetic random access memory (MRAM), an e-fuse, and the like.

SUMMARY

According to an embodiment of the present disclosure, a semiconductor device may include first row lines each extending in a first direction, column lines each extending in a second direction crossing the first direction, second row lines each extending in the first direction, a plurality of first memory cells respectively coupled between the first row lines and the column lines, each of the plurality of first memory cells including a first variable resistance layer and a first dielectric layer positioned between the first variable resistance layer and a corresponding one of the first row lines, and a plurality of second memory cells respectively coupled between the second row lines and the column lines, each of the plurality of second memory cells including a second variable resistance layer and a second dielectric layer positioned between the second variable resistance layer and a corresponding one of the second row lines.

According to an embodiment of the present disclosure, a semiconductor device may include a first memory deck comprising a plurality of first memory cells respectively coupled between first row lines and column lines crossing the first row lines, and a second memory deck comprising a plurality of second memory cells respectively coupled between the column lines and second row lines crossing the column lines. Each of the plurality of first memory cells may include a first variable resistance layer, and each of the plurality of second memory cells may include a second variable resistance layer. A first read pulse of a first polarity may be applied during a read operation of each of the plurality of first memory cells, and a second read pulse of a second polarity different from the first polarity may be applied during a read operation of each of the plurality of second memory cells.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Embodiments of the present disclosure relate to a semiconductor device capable of improving an operation characteristic and reliability of a memory cell.

Figure 1:
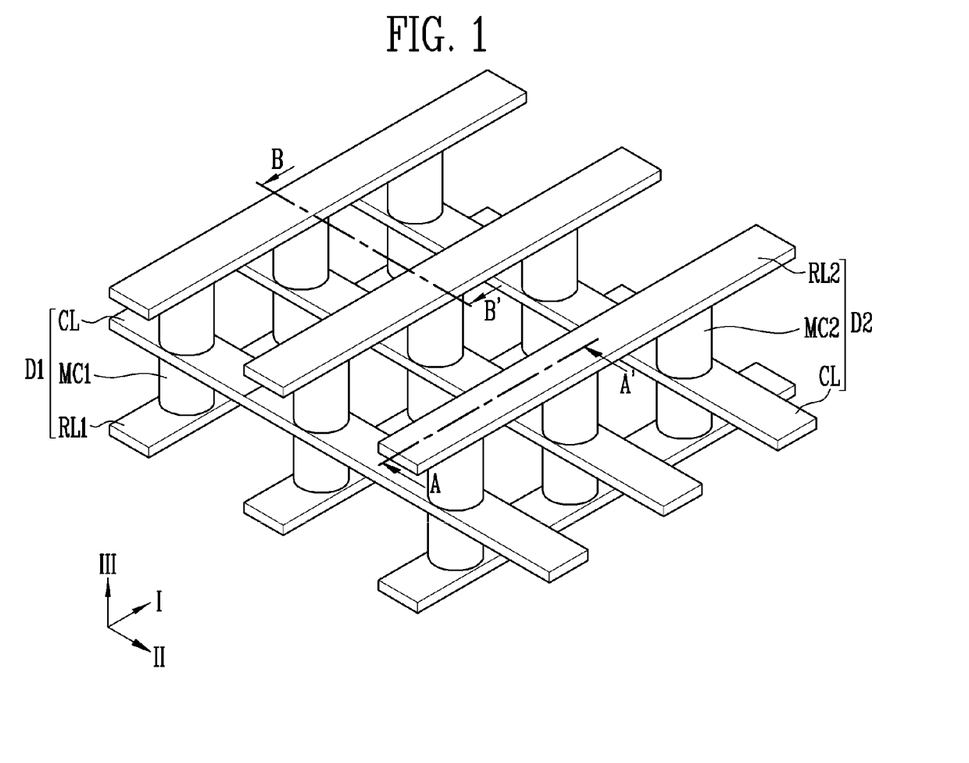
FIG. 1 is a diagram illustrating a cell array structure of a semiconductor device according to an embodiment of the present disclosure.

FIG. 1 is a diagram illustrating a cell array structure of a semiconductor device according to an embodiment of the present disclosure.

Referring to FIG. 1, the semiconductor device may include a plurality of first row lines RL1, a plurality of column lines CL, a plurality of second row lines RL2, a plurality of first memory cells MC1, and a plurality of second memory cells MC2. As an embodiment, the first row lines RL1 and the second row lines RL2 may be word lines, and the column lines CL may be bit lines. Alternatively, the first row lines RL1 and the second row lines RL2 may be bit lines, and the column lines CL may be word lines.

The first row lines RL1 and the second row lines RL2 may extend in a first direction I. The column lines CL may cross the first row lines RL1 and the second row lines RL2 and may extend in a second direction II.

The first row lines RL1 and the second row lines RL2 may be stacked in a third direction III. The third direction III may be a direction crossing a plane defined by the first direction I and the second direction II. For example, the third direction III may be orthogonal to the plane defined by the first direction I and the second direction II. The column lines CL may be positioned between the first row lines RL1 and the second row lines RL2. The first row lines RL1, the column lines CL, and the second row lines RL2 may be sequentially stacked in the third direction III.

The first memory cells MC1 may be connected between the first row lines RL1 and the column lines CL, respectively. The first memory cells MC1 may be arranged in the first direction I and the second direction II. The second memory cells MC2 may be connected between the second row lines RL2 and the column lines CL, respectively. The second memory cells MC2 may be arranged in the first direction I and the second direction II. The first memory cells MC1 and the second memory cells MC2 may be stacked in the third direction III.

The first row lines RL1, the first memory cells MC1, and the column lines CL may configure a first memory deck D1. The second row lines RL2, the second memory cells MC2, and the column lines CL may configure a second memory deck D2. In the embodiment shown in FIG. 1, the first deck D1 and the second deck D2 may share the column lines CL. However, embodiments of the present disclosure are not limited thereto, and the first deck D1 and the second deck D2 may not share the column lines. As an embodiment, the first deck D1 may include first column lines, and the second deck D2 may include second column lines.

In addition, although not shown in the drawing, the semiconductor device may further include a column circuit for controlling the column lines CL and a row circuit for controlling the row lines RL1 and RL2. The row circuit may be a row decoder, a word line decoder, a word line driver, and the like. The row circuit may select a row line on which a program operation is to be performed according to a row address. The column circuit may be a column decoder, a bit line decoder, a bit line driver, and the like. The column circuit may select a column line on which the program operation is to be performed according to a column address. During the program operation, a memory cell connected between the selected column line and the selected row line may be selected.

Figure 2A:
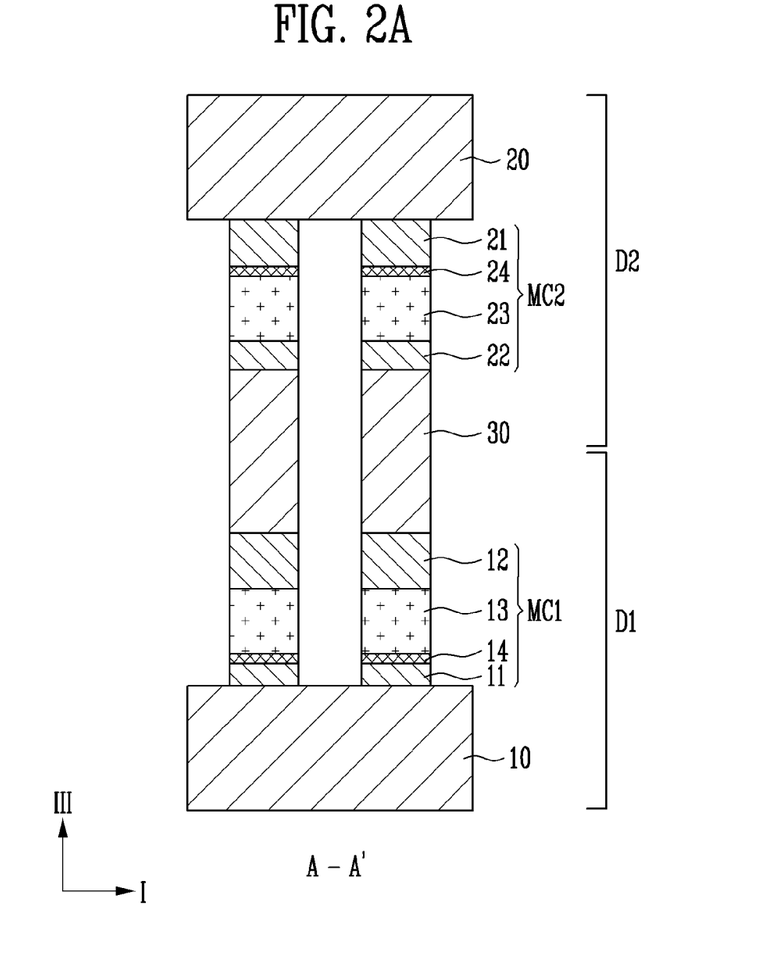
FIGS. 2A and 2B are diagrams illustrating a structure of a semiconductor device according to an embodiment of the present disclosure.
Figure 2B:
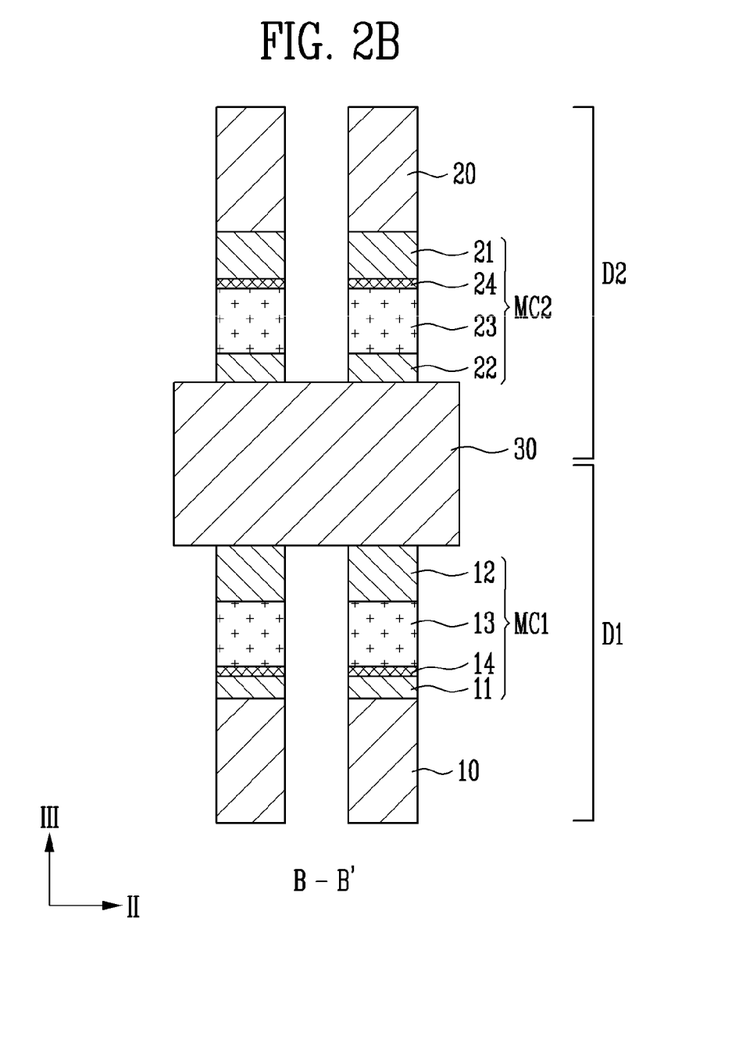

FIGS. 2A and 2B are diagrams illustrating a structure of a semiconductor device according to an embodiment of the present disclosure. FIG. 2A may be a cross-sectional view along the line A-A' in the first direction I of FIG. 1, and FIG. 2B may be a cross-sectional view along the line B-B' in the second direction II of FIG. 1. Hereinafter, a content repetitive to the previously described content may be omitted for the interest of brevity.

Referring to FIGS. 2A and 2B, the semiconductor device may include the first deck D1 and the second deck D2. The first deck D1 may include a plurality of first row lines 10, a plurality of first memory cells MC1, and a plurality of column lines 30. The second deck D2 may include a plurality of second row lines 20, a plurality of second memory cells MC2, and the plurality of column lines 30.

Each of the first memory cells MC1 may include a first electrode 11, a second electrode 12, a first variable resistance layer 13, and a first resistance element (e.g., a first dielectric layer 14). The first electrode 11 may be a portion of the first row line 10 or may be electrically connected to the first row line 10. The first electrode 11 may include a conductive material such as polysilicon or metal. As an embodiment, the first electrodes 11 may include polysilicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), molybdenum (Mo), ruthenium (Ru), or the like, or may include a combination thereof.

The second electrode 12 may be a portion of the column line 30 or may be electrically connected to the column line 30. As an embodiment, when the first electrode 11 is electrically connected to the word line, the second electrode 12 may be electrically connected to the bit line. The second electrodes 12 may include the same material as the first electrodes 11 or may include a material different from that of the first electrodes 11. The second electrodes 12 may include a conductive material such as polysilicon or metal. As an embodiment, the second electrodes 12 may include polysilicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), molybdenum (Mo), ruthenium (Ru), or the like, or may include a combination thereof.

The first variable resistance layer 13 may be positioned between the first electrode 11 and the second electrode 12. The first variable resistance layer 13 may include a resistive material, and may have a property of reversibly transitioning between different resistance states according to an applied voltage or current. The first variable resistive layer 13 may be used as a data storage and a selection element simultaneously.

As an embodiment, the first variable resistance layer 13 may include a variable resistance material of which a resistance changes without a phase change, and may include a chalcogenide-based material. The first variable resistive layer 13 may include germanium (Ge), antimony (Sb), tellurium (Te), arsenic (As), selenium (Se), silicon (Si), indium (In), tin (Sn), sulfur (S), gallium (Ga), or the like, or may include a combination thereof. In addition, the first variable resistance layer 13 may further include boron (B), nitrogen (N), carbon (C), bismuth (Bi), nickel (Ni), manganese (Mn), silver (Ag), or the like, or may further include a combination thereof. The first variable resistance layer 13 may maintain an amorphous state during the program operation, and may not be changed to a crystalline state after the program operation. During the program operation, a threshold voltage of the first memory cell MC1 may be changed according to a program voltage applied to the first memory cell MC1. According to the threshold voltage, the first memory cell MC1 may be programmed to at least two states.

The first dielectric layer 14 may be positioned between the first variable resistance layer 13 and the first row line 10. As an embodiment, the first dielectric layer 14 may be positioned between the first variable resistance layer 13 and the first electrode 11. The first dielectric layer 14 may be in contact with the first electrode 11 and the first variable resistance layer 13. When performing the program operation, a current may flow through the first dielectric layer 14, and thus data may be stored in the first memory cell MC1. The first dielectric layer 14 may have a thickness of 1 to 20 Å. In an embodiment, the first dielectric layer 14 may have a thickness of 5 to 10 Å or 8 to 13 Å. When the thickness of the first dielectric layer 14 is less than 1 Å, the first dielectric layer 14 may not sufficiently increase the second threshold voltage resulting from the reset operation. When the thickness of the first dielectric layer 14 exceeds 20 Å, the time for the operation of the first memory cells MC1 may be relatively increased and/or the yield of the first memory cells MC1 may be decreased. The first dielectric layer 14 may include a dielectric material such as oxide or nitride. As an embodiment, the first dielectric layer 14 may include silicon oxide (SiOx), silicon nitride (SiNx), aluminum oxide (AlOx), zirconium oxide ($ZrO_2$), hafnium oxide (HfOx), titanium oxide (TiOx), or tantalum oxide (TaOx), or may include a combination thereof.

The first memory cell MC1 may have an asymmetric structure by the first dielectric layer 14. In an embodiment, the first memory cell MC1 may have an asymmetric structure by including the first dielectric layer 14 such that the first memory cell MC1 has a first interface between the first electrode 11 and the first dielectric layer 14 and a second interface between the second electrode 12 and the first variable resistance layer 13, the first interface having the higher resistivity than the second interface. For example, the first dielectric layer 14 may be positioned only between the first row line 10 and the first variable resistance layer 13, and the first dielectric layer 14 may not be positioned between the column line 30 and the first variable resistance layer 13. The first dielectric layer 14 may act as a barrier layer.

The second memory cells MC2 may have a configuration similar to that of the first memory cells MC1. Each of the second memory cells MC2 may include a first electrode 21, a second electrode 22, a second variable resistance layer 23, and a second resistance element (e.g., a second dielectric layer 24). The first electrode 21 may be a portion of the second row line 20 or may be electrically connected to the second row line 20. The first electrode 21 may include the same material as the first electrode 11 of the first memory cell MC1 or may include a material different from that of the first electrode 11 of the first memory cell MC1. The second electrode 22 may be a portion of the column line 30 or may be electrically connected to the column line 30. The second electrode 22 may include the same material as the second electrode 12 of the first memory cell MC1 or may include a material different from that of the second electrode 12 of the first memory cell MC1.

The second variable resistance layer 23 may be positioned between the first electrode 21 and the second electrode 22. The second variable resistance layer 23 may include the same material as the first variable resistance layer 13 or may include a material different from that of the first variable resistance layer 13. The second variable resistance layer 23 may include a resistive material, and may have a property of reversibly transitioning between different resistance states according to an applied voltage or current. The second variable resistive layer 23 may be used as a data storage and a selection element simultaneously.

The second dielectric layer 24 may be positioned between the second variable resistance layer 23 and the second row line 20. As an embodiment, the second dielectric layer 24 may be positioned between the second variable resistance layer 23 and the first electrode 21. The second dielectric layer 24 may be in contact with the first electrode 21 and the second variable resistance layer 23. When performing the program operation, a current may flow through the second dielectric layer 24, and thus data may be stored in the second memory cell MC2. The second dielectric layer 24 may have a thickness of 1 to 20 Å. The second dielectric layer 24 may include the same material as the first dielectric layer 14 or may include a material different from that of the first dielectric layer 14. The second dielectric layer 24 may include a dielectric material such as oxide or nitride. As an embodiment, the second dielectric layer 24 may include silicon oxide (SiOx), silicon nitride (SiNx), aluminum oxide (AlOx), zirconium oxide ($ZrO_2$), hafnium oxide (HfOx), titanium oxide (TiOx), or tantalum oxide. (TaOx), or may include a combination thereof.

The second memory cell MC2 may have an asymmetric structure by the second dielectric layer 24. The second dielectric layer 24 may be positioned only between the second row line 20 and the second variable resistance layer 23, and the second dielectric layer 24 may not be positioned between the column line 30 and the second variable resistance layer 23. Based on the column line 30, the first memory cell MC1 and the second memory cell MC2 may have a symmetric structure. The second dielectric layer 24 may act as a barrier layer.

According to the structure as described above, each of the first memory cells MC1 and the second memory cells MC2 may have an asymmetric structure. Through this, a change width of the threshold voltage may be increased, and a read window margin may be secured. Specifically, a first threshold voltage may result when a first program pulse having a first polarity and a read pulse having the first polarity are applied across the first memory cell MC1. A second threshold voltage higher than the first threshold voltage may result when a second program pulse having a second polarity and a read pulse having the first polarity are applied across the first memory cell MC1. When the column line 30 functions as a bit line and the first row line 10 functions as a word line, the first memory cell MC1 has an asymmetric structure in which the first dielectric layer 14 is disposed closer to the first row line 10 than the column line 30, thereby increasing the second threshold voltage compared to when the first memory cell MC1 does not include the first dielectric layer 14. Since a read window margin of the first memory cell MC1 is a difference between the second threshold voltage and the first threshold voltage, the asymmetric structure of the first memory cell MC1 may increase the read window margin to improve the reliability of the first memory cell MC1. Similarly, when the column line 30 functions as a bit line and the second row line 20 functions as a word line, the second memory cell MC2 has an asymmetric structure in which the second dielectric layer 24 is disposed closer to the second row line 20 than the column line 30, thereby increasing a read window margin of the second memory cell MC2 to improve the reliability of the second memory cell MC2. In addition, the first memory cells MC1 and the second memory cells MC2 may have a symmetric structure based on the column line 30. For example, the second electrode 12, the first variable resistance layer 13, the first dielectric layer 14, and the first electrode 11 of the first memory cell MC1 may correspond to the second electrode 22, the second variable resistance layer 23, the second dielectric layer 24, and the first electrode 21 of the second memory cell MC2, respectively, with respect to the column line 30. Through this, both of the first deck D1 and the second deck D2 may increase the threshold voltage change width.

For reference, only some of the decks included in the cell array may include a dielectric layer. As an embodiment, the first memory cells MC1 may include the first dielectric layers 14 and the second memory cells MC2 may not include the second dielectric layers 24. Alternatively, the first memory cells MC1 may not include the first dielectric layers 14 and the second memory cells MC2 may include the second dielectric layers 24.

Figure 3A:
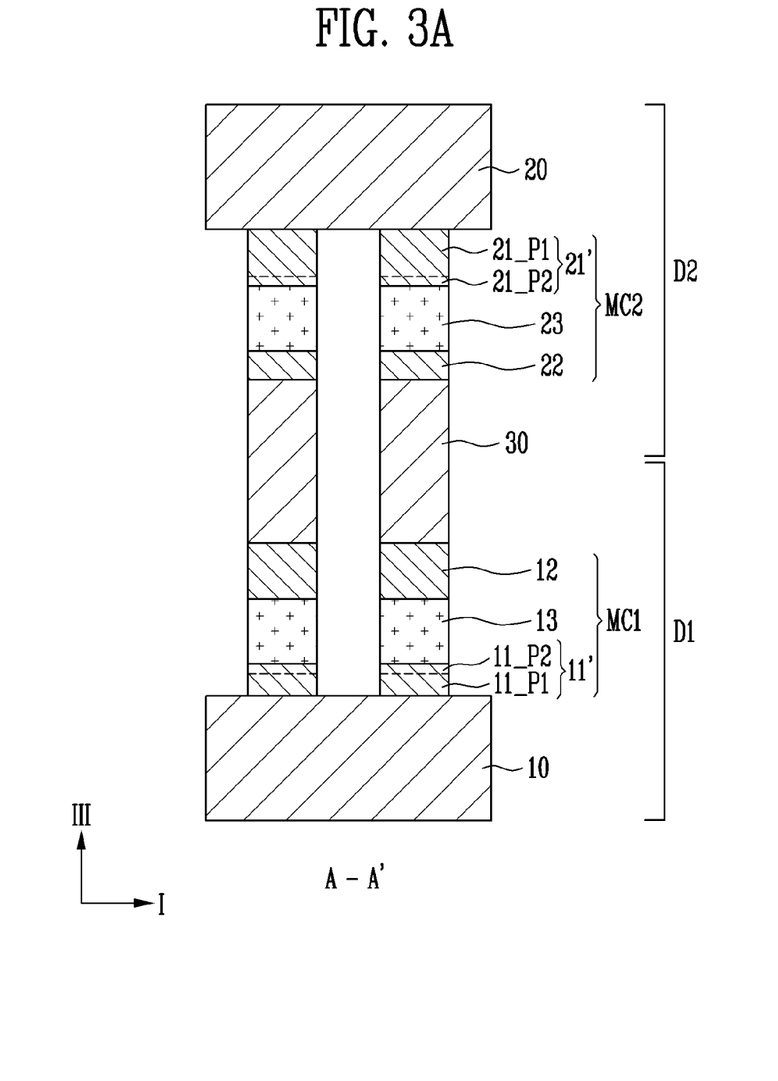
FIGS. 3A and 3B are diagrams illustrating a structure of a semiconductor device according to an embodiment of the present disclosure.
Figure 3B:
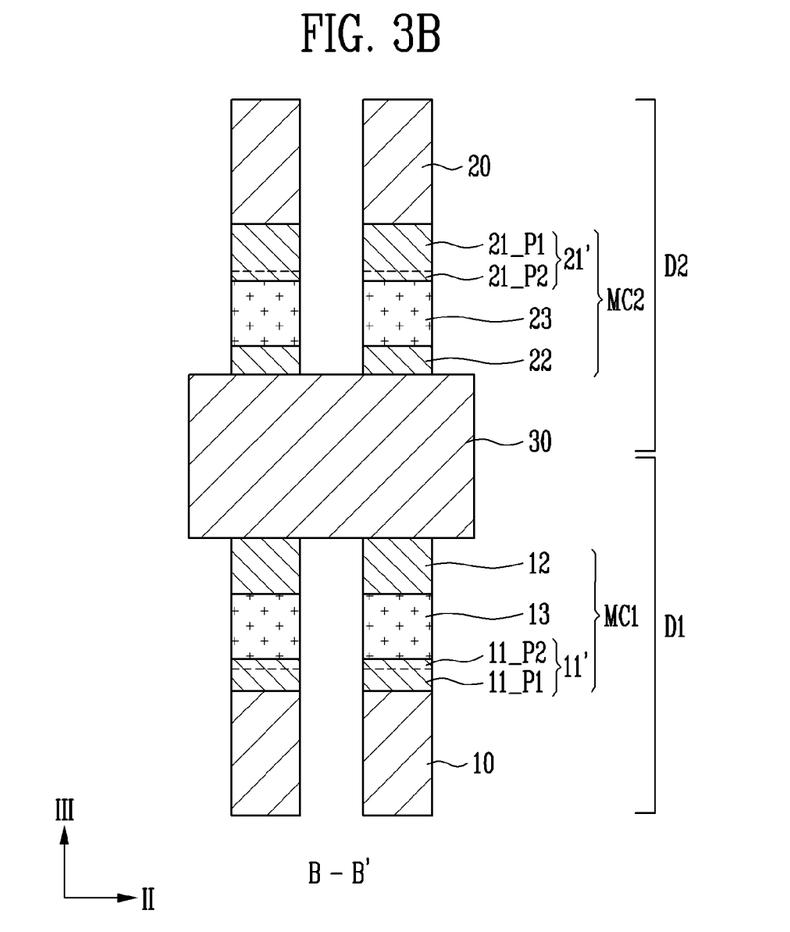

FIGS. 3A and 3B are diagrams illustrating a structure of a semiconductor device according to an embodiment of the present disclosure. FIG. 3A may be a cross-sectional view along the line AA' in the first direction I of FIG. 1, and FIG. 3B may be a cross-sectional view along the line BB' in the second direction II of FIG. 1. Hereinafter, a content repetitive to the previously described content may be omitted for the interest of brevity.

Referring to FIGS. 3A and 3B, the semiconductor device may include a first deck D1 and a second deck D2. The first deck D1 may include a plurality of first row lines 10, a plurality of first memory cells MC1, and a plurality of column lines 30. The second deck D2 may include a plurality of second row lines 20, a plurality of second memory cells MC2, and the plurality of column lines 30.

Each of the first memory cells MC1 may include a first electrode 11', a second electrode 12, and a first variable resistance layer 13. The first electrode 11' may include a first portion 11_P1 adjacent to the first row line 10 and a second portion 11_P2 adjacent to the first variable resistance layer 13. The second portion 11_P2 may have a specific resistance higher than that of the first portion 11_P1. As an embodiment, the second portion 11_P2 may have a nitrogen concentration higher than that of the first portion 11_P1. The first portion 11_P1 and the second portion 11_P2 may be films formed by a separate deposition process, and an interface may exist between the first portion 11_P1 and the second portion 11_P2. The second portion 11_P2 may be formed by performing a surface treatment on the first electrode 11, and an interface may not exist between the first portion 11_P1 and the second portion 11_P2. The first memory cell MC1 may have an asymmetric structure by the second portion 11_P2. The second electrode 12 may not include a portion having a relatively high specific resistance.

Here, the first electrode 11' may have a specific resistance higher than that of the second electrode 12. The second portion 11_P2 may have a specific resistance higher than that of the second electrode 12 or may have a nitrogen concentration higher than that of the second electrode 12. The first portion 11_P1 and the second portion 11_P2 may have a specific resistance higher than that of the second electrode 12 or may have a nitrogen concentration higher than that of the second electrode 12.

The second memory cells MC2 may have a configuration similar to that of the first memory cells MC1. Each of the second memory cells MC2 may include a first electrode 21', a second electrode 22, and a second variable resistance layer 23. The first electrode 21' may include a first portion 21_P1 adjacent to the second row line 20 and a second portion 21_P2 adjacent to the second variable resistance layer 23. The second portion 21_P2 may have a specific resistance higher than that of the first portion 21_P1. As an embodiment, the second portion 21_P2 may have a nitrogen concentration higher than that of the first portion 21_P1. The second memory cell MC2 may have an asymmetric structure by the second portion 21_P2. The second electrode 22 may not include a portion having a relatively high specific resistance.

Here, the first electrode 21' may have a specific resistance higher than that of the second electrode 22. The second portion 21_P2 may have a specific resistance higher than that of the second electrode 22 or may have a nitrogen concentration higher than that of the second electrode 22. The first portion 21_P1 and the second portion 21_P2 may have a specific resistance higher than that of the second electrode 22 or may have a nitrogen concentration higher than that of the second electrode 22.

According to the structure as described above, each of the first memory cells MC1 and the second memory cells MC2 may have an asymmetric structure. Through this, the change width of the threshold voltage may be increased, and the read window margin may be secured. In addition, the first memory cells MC1 and the second memory cells MC2 may have a symmetric structure based on the column line 30. Through this, both of the first deck D1 and the second deck D2 may increase the threshold voltage change width.

For reference, only some of the decks included in the cell array may include the second portion. As an embodiment, the first memory cells MC1 may include the second portion 11_P2 and the second memory cells MC2 may not include the second portion 21_P2. Alternatively, the first memory cells MC1 may not include the second portion 11_P2 and the second memory cells MC2 may include the second portion 21_P2.

Figure 4A:
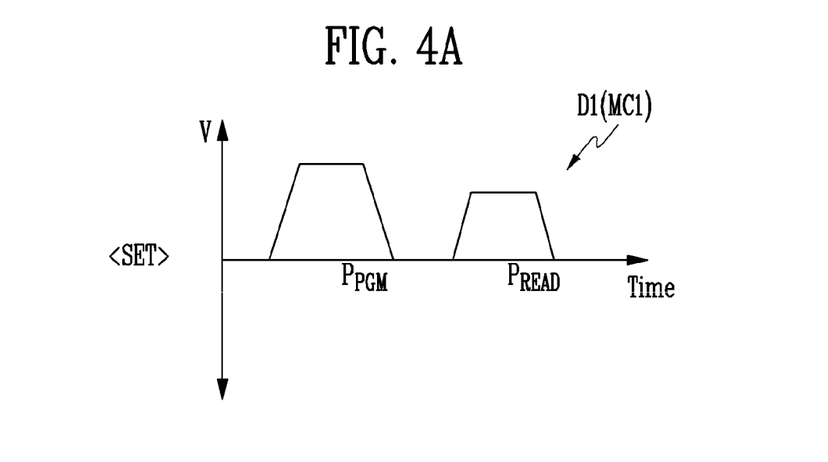
FIGS. 4A and 4B are diagrams illustrating an operation of a semiconductor device according to an embodiment of the present disclosure.
Figure 4B:
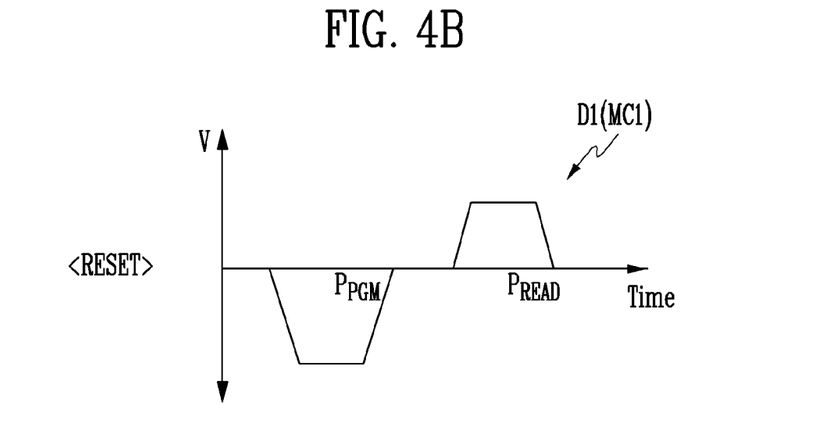

FIGS. 4A and 4B are diagrams illustrating an operation of a semiconductor device according to an embodiment of the present disclosure. In each graph, an x-axis may indicate a time and a y-axis may indicate a voltage. Hereinafter, a content repetitive to the previously described content may be omitted for the interest of brevity.

FIG. 4A illustrates performing a first operation (e.g., a set operation) on one or more of the plurality of first memory cells MC1 included in the first deck D1. During the set operation, a program pulse $P_{PGM}$ of a first polarity is applied to a first memory cell MC1 selected from among the plurality of first memory cells MC1. The first polarity may be a positive polarity. For example, when the program pulse $P_{PGM}$ having the positive polarity is applied to the first memory cell MC1, a first voltage (e.g., a positive voltage) may be applied to the column line 30 and a second voltage (e.g., 0V) lower than the first voltage may be applied to the first row line 10. During the read operation, a read pulse $P_{READ}$ of the first polarity may be applied to a first memory cell MC1 selected from among the plurality of first memory cells MC1.

FIG. 4B illustrates performing a second operation (e.g., a reset operation) on one or more of the plurality of first memory cells MC1 included in the second deck D2. During the reset operation, a program pulse $P_{PGM}$ of a second polarity different from the first polarity is applied to a first memory cell MC1 selected from among the plurality of first memory cells MC1. The second polarity may be a negative polarity. For example, when the program pulse $P_{PGM}$ having the negative polarity is applied to the first memory cell MC1, a first voltage (e.g., 0V) may be applied to the column line 30 and a second voltage (e.g., a positive voltage) higher than the first voltage may be applied to the first row line 10. During the read operation, a read pulse $P_{READ}$ of the first polarity may be applied to a first memory cell MC1 selected from among the plurality of first memory cells MC1. The first polarity may be the positive polarity.

The program pulse $P_{PGM}$ of the second polarity used during the reset operation and the program pulse $P_{PGM}$ of the first polarity used during the set operation may have substantially the same waveform except that the polarities are different. Alternatively, not only the polarity but also the waveform may be different. The waveform may include a pulse width, a peak value, and the like.

According to the operation method described above, the first memory cell MC1 of a set state may have a first threshold voltage. The first memory cell MC1 of the reset state may have a second threshold voltage different from the first threshold voltage. The second threshold voltage may have a level higher than that of the first threshold voltage. Specifically, the first memory cell MC1 may have the first threshold voltage when the program pulse $P_{PGM}$ and the read pulse $P_{READ}$ have the same polarity (e.g., the first polarity), whereas the first memory cell MC1 may have the second threshold voltage higher than the first threshold voltage when the program pulse $P_{PGM}$ and the read pulse $P_{READ}$ have opposite polarities. Therefore, data may be stored in the first memory cell MC1 by using a threshold voltage difference.

Because the first memory cells MC1 have an asymmetric structure by the first dielectric layer 14 or the second portion 11_P2, the first memory cells MC1 may have the second threshold voltage higher than that of a memory cell that does not include the first dielectric layer 14 or the second portion 11_P2 or a memory cell having a symmetric structure. For example, when the program pulse $P_{PGM}$ of a second polarity is applied to the first memory cell MC1 during the reset operation and the read pulse $P_{READ}$ of a first polarity is applied to the first memory cell MC1 by applying a first voltage to a first line (e.g., the first row line 10) and a second voltage to a second line (e.g., the column line 30), the second voltage being higher than the first voltage, the first dielectric layer 14 or the second portion 11_P2 of the first memory cell MC1 may be disposed closer to the first line than the second line. Therefore, the change width of the threshold voltage may be increased, and the read window margin may be secured.

Figure 5A:
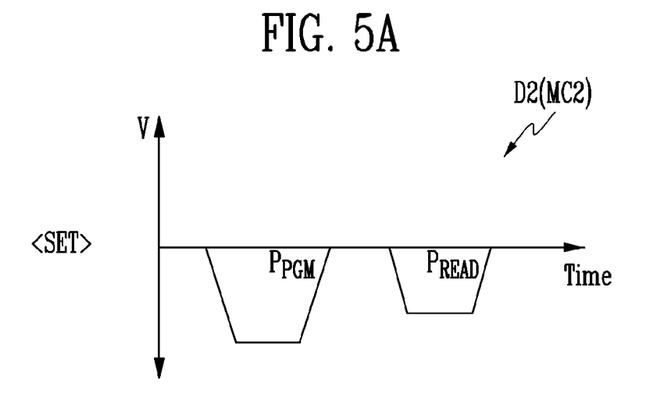
FIGS. 5A and 5B are diagrams illustrating an operation of a semiconductor device according to an embodiment of the present disclosure.
Figure 5B:
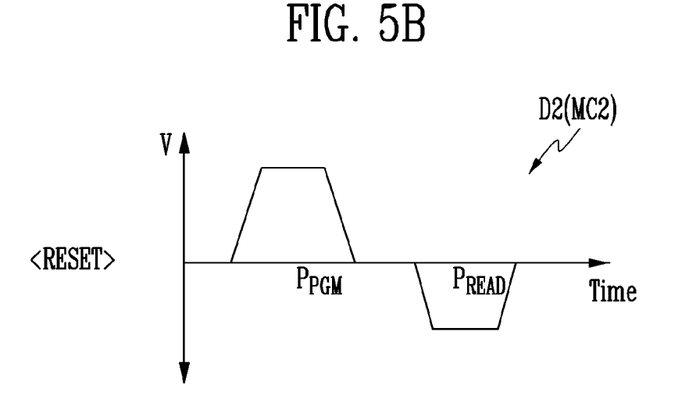

FIGS. 5A and 5B are diagrams illustrating an operation of a semiconductor device according to an embodiment of the present disclosure. In each graph, an x-axis may indicate a time and a y-axis may indicate a voltage.

FIG. 5A illustrates performing a first operation (e.g., a set operation) on one or more of the plurality of second memory cells MC2 included in the second deck D2. During the set operation, a program pulse $P_{PGM}$ of a second polarity is applied to a second memory cell MC2 selected from among the plurality of second memory cells MC2. The second polarity may be a negative polarity. For example, when the program pulse $P_{PGM}$ having the negative polarity is applied to the second memory cell MC2, a first voltage (e.g., 0V) may be applied to the second row line 20 and a second voltage (e.g., a positive voltage) higher than the first voltage may be applied to the column line 30. During the read operation, a read pulse $P_{READ}$ of the second polarity may be applied to a second memory cell MC2 selected from among the plurality of second memory cells MC2.

FIG. 5B illustrates performing a second operation (e.g., a reset operation) on one or more of the plurality of second memory cells MC2 included in the second deck D2. During the reset operation, a program pulse $P_{PGM}$ of a first polarity is applied to a second memory cell MC2 selected from among the plurality of second memory cells MC2. The first polarity may be a positive polarity. For example, when the program pulse $P_{PGM}$ having the positive polarity is applied to the second memory cell MC2, a first voltage (e.g., a positive voltage) may be applied to the second row line 20 and a second voltage (e.g., 0V) lower than the first voltage may be applied to the column line 30. During the read operation, a read pulse $P_{READ}$ of the second polarity may be applied to a second memory cell MC2 selected from among the plurality of second memory cells MC2. The second polarity may be the negative polarity.

The program pulse $P_{PGM}$ of the first polarity used during the reset operation and the program pulse $P_{PGM}$ of the second polarity used during the set operation may have substantially the same waveform except that the polarities are different. Alternatively, not only the polarity but also the waveform may be different.

According to the operation method described above, the second memory cell MC2 of a set state may have a first threshold voltage. The second memory cell MC2 of the reset state may have a second threshold voltage higher than the first threshold voltage. Therefore, data may be stored in the second memory cell MC2 by using a threshold voltage difference.

The second memory cells MC2 not only have an asymmetric structure by the second dielectric layer 24 or the second portion 21_P2, but also have a symmetric structure with the first memory cells MC1 based on the column line 30. Even though the second memory cells MC2 have the asymmetric structure, when the second dielectric layer 24 or the second portion 21_P2 is positioned between the column line 30 and the second variable resistance layer 23, the second threshold voltage may decrease. That is, when the program pulse $P_{PGM}$ of a first polarity is applied to the second memory cell MC2 during the reset operation, the read pulse $P_{READ}$ of a second polarity may be applied to the second memory cell MC2 by applying a first voltage to a first line (e.g., the column line 30) and a second voltage to a second line (e.g., the second row line 20), the first voltage being higher than the second voltage. Assuming that the second dielectric layer 24 or the second portion 21_P2 of the second memory cell MC2 may be positioned between the column line 30 and the second variable resistance layer 23 to dispose the second dielectric layer 24 or the second portion 21_P2 farther from the second row line 20 than from the column line 30, the second threshold voltage may decrease and thus the read window margin may also decrease. On the other hand, in the embodiments shown in FIGS. 2A to 3B, the second dielectric layer 24 or the second portion 21_P2 may be positioned between the second row line 20 and the second variable resistance layer 23 to dispose the second dielectric layer 24 or the second portion 21_P2 closer to the second row line 20 than to the column line 30. As a result, when the read pulse $P_{READ}$ of the second polarity may be applied to each of the second memory cells MC2 as described above, the second threshold voltage of the second memory cells MC2 may increase and thus the read window margin may also increase. Namely, the change width of the threshold voltage may be increased, and the read window margin may be secured.

Referring to FIGS. 4A, 4B, 5A, and 5B, the program pulse of the first polarity may be used during the set operation of the first memory cells MC1, and the program pulse of the second polarity may be used during the set operation of the second memory cells MC2. The second program pulse of the second polarity may be used during the reset operation of the first memory cells MC1, and the first program pulse of the first polarity may be used during the set operation of the second memory cells MC2.

Here, the program pulse $P_{PGM}$ used during the set operation of the first memory cells MC1 and the program pulse $P_{PGM}$ used during the reset operation of the second memory cells MC2 may have the same polarity and substantially the same waveform. Alternatively, only the polarity may be the same and the waveform may be different. The program pulse $P_{PGM}$ used during the reset operation of the first memory cells MC1 and the program pulse $P_{PGM}$ used during the set operation of the second memory cells MC2 may have the same polarity and substantially the same waveform. Alternatively, only the polarity may be the same and the waveform may be different.

The read pulse $P_{READ}$ of the first polarity may be used during the read operation of the first memory cells MC1, and the read pulse $P_{READ}$ of the second polarity may be used during the read operation of the second memory cells MC2. Here, the read pulse $P_{READ}$ of the first polarity and the read pulse P$_{READ}$ of the second polarity may have substantially the same waveform except that the polarities are different. Alternatively, not only the polarity but also the waveform may be different.

According to the operation method described above, the first memory cells MC1 of the first deck D1 and the second memory cells MC2 of the second deck D2 may be programmed using the program pulse V$_{PGM}$ of different polarities. In addition, the first memory cells MC1 of the first deck D1 and the second memory cells MC2 of the second deck D2 may be read using the read pulse V$_{READ}$ of different polarities. Therefore, read margins of both of the first memory cells MC1 and the second memory cells MC2 may be secured.

A memory circuit or the semiconductor device of the above-described embodiments may be used in various devices or systems. FIGS. 6 to 9 illustrate some examples of a device or a system that may implement the memory circuit or the semiconductor device of the above-described embodiments.

Figure 6:
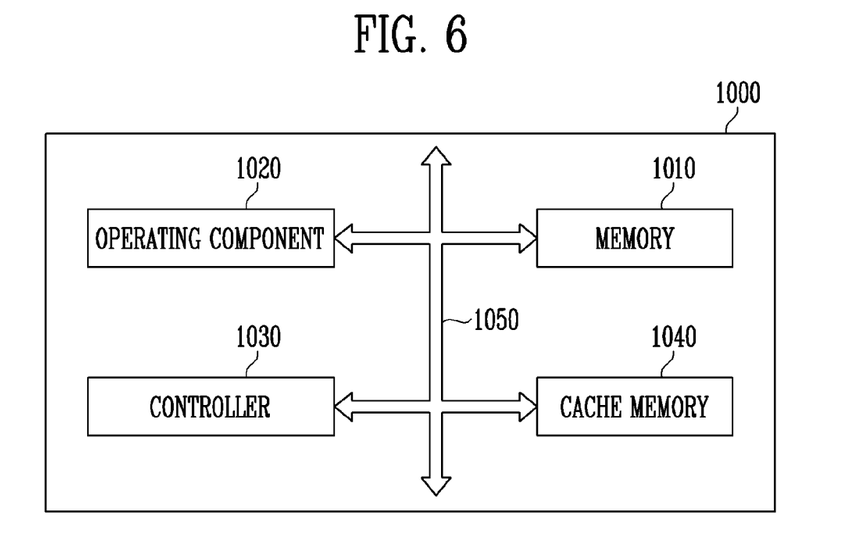
FIG. 6 is an example of a configuration diagram of a microprocessor implementing a memory device according to an embodiment of the present disclosure.

FIG. 6 is an example of a configuration diagram of a microprocessor implementing a memory device according to an embodiment of the present disclosure.

Referring to FIG. 6, the microprocessor 1000 may control and adjust a series of processes of receiving data from various external devices, processing the data, and transmitting a result of the process to the external device, and may include a memory 1010, an operating component 1020, a controller 1030, and the like. The microprocessor 1000 may be various data processing devices such as a central processing unit (CPU), a graphic processing unit (GPU), and a digital signal processor (DSP), an application processor.

The memory 1010 may be a processor register, a register, or the like, may store data in the microprocessor 1000, may include various registers such as a data register, an address register, and a floating point register. The memory 1010 may temporarily store addresses at which data for performing an operation in the operating component 1020, data of a result of the performance, and data for the performance are stored.

The memory 1010 may include one or more embodiments of the semiconductor device described above. For example, the memory 1010 may include one or more memory elements. The memory element may include first row lines extending in a first direction, column lines extending in a second direction crossing the first direction, second row lines extending in the first direction, first memory cells respectively connected between the first row lines and the column lines and including a first variable resistance layer and a first dielectric layer positioned between the first variable resistance layer and the first row line, and second memory cells respectively connected between the second row lines and the column lines and including a second variable resistance layer and a second dielectric layer positioned between the second variable resistance layer and the second row line. Therefore, reliability of the memory 1010 may be improved and a manufacturing process may be improved. As a result, an operation characteristic of the microprocessor 1000 may be improved.

The operating component 1020 may perform various arithmetic operations or logical operations according to a result obtained by decoding an instruction by the controller 1030. The operating component 1020 may include one or more arithmetic and logic units (ALUs) and the like.

The controller 1030 may receive a signal from an external device such as the memory 1010, the operating component 1020, and the microprocessor 1000, perform extraction or decoding of an instruction and control of a signal input/output of the microprocessor 1000, and the like, and execute a process indicated by a program.

The microprocessor 1000 according to the present embodiment may further include a cache memory 1040 capable of temporarily storing data input from an external device or data to be output to an external device, in addition to the memory 1010. In this case, the cache memory 1040 may exchange data with the memory 1010, the operating component 1020, and the controller 1030 through a bus interface 1050.

Figure 7:
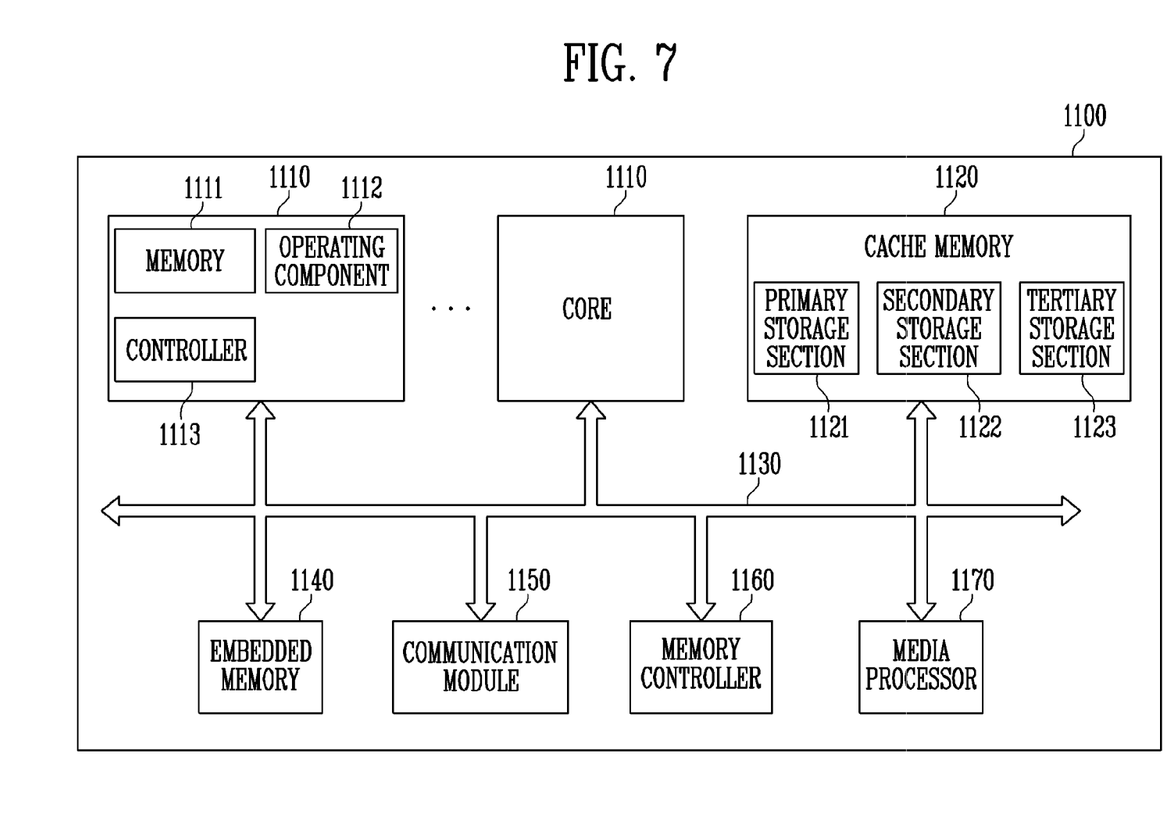
FIG. 7 is an example of a configuration diagram of a processor implementing a memory device according to an embodiment of the present disclosure.

FIG. 7 is an example of a configuration diagram of a processor implementing a memory device according to an embodiment of the present disclosure.

Referring to FIG. 7, the processor 1100 may include various functions in addition to the functions of the microprocessor 1000 described above, and thus performance may be improved and multi-function may be implemented. The processor 1100 may include a core 1110 serving as a microprocessor, a cache memory 1120 temporarily store data, and a bus interface 1130 for transferring data between internal and external devices. The processor 1100 may include various system on chips (SoCs) such as a multi core processor, a graphic processing unit (GPU), and an application processor (AP).

The core 1110 of the present embodiment may be a part for performing an arithmetic logic operation on data input from an external device and may include a memory 1111, an operating component 1112, and a controller 1113. The memory 1111, the operating component 1112, and the controller 1113 may be substantially the same as the memory 1010, the operating component 1020, and the controller 1030 described above.

The cache memory 1120 temporarily stores data to compensate for a data process speed difference between the core 1110 operating at a high speed and an external device operating at a low speed. The cache memory 1120 may include a primary storage 1121 and a secondary storage 1122, and may include a tertiary storage 1123 when a high capacity is required. The cache memory 1120 may include more storages as needed. That is, the number of storages included in the cache memory 1120 may vary depending on design. Here, process speeds for storing and discriminating data in the primary, secondary, and tertiary storages 1121, 1122, and 1123 may be the same or different. When the process speeds of each storage are different, the speed of the primary storage may be the fastest. One or more of the primary storage 1121, the secondary storage 1122, and the tertiary storage 1123 of the cache memory 1120 may include one or more embodiments of the semiconductor device described above. For example, the cache memory 1120 may include one or more memory elements. The memory element may include first row lines extending in a first direction, column lines extending in a second direction crossing the first direction, second row lines extending in the first direction, first memory cells respectively connected between the first row lines and the column lines and including a first variable resistance layer and a first dielectric layer positioned between the first variable resistance layer and the first row line, and second memory cells respectively connected between the second row lines and the column lines and including a second variable resistance layer and a second dielectric layer positioned between the second variable resistance layer and the second row line. Therefore, reliability of the cache memory 1120 may be improved and a manufacturing process may be improved. As a result, an operation characteristic of the processor 1100 may be improved.

In the present embodiment, a case where all of the primary, secondary, and tertiary storages 1121, 1122, and 1123 are configured in the cache memory 1120 is shown. However, some or all of the primary, secondary, and tertiary storages 1121, 1122, and 1123 may be configured inside the core 1110 and compensate for the process speed difference between the core 1110 and the external device.

The bus interface 1130 connects the core 1110, the cache memory 1120, and an external device so as to efficiently transmit data.

The processor 1100 according to the present embodiment may include a plurality of cores 1110 and the plurality of cores 1110 may share the cache memory 1120. The plurality of cores 1110 and the cache memory 1120 may be directly connected to each other or may be connected to each other through the bus interface 1130. All of the plurality of cores 1110 may be configured identically to the core described above.

The processor 1100 according to the present embodiment may include an embedded memory 1140 that stores data, a communication module 1150 that may transmit and receive data in a wired manner or wirelessly with an external device, a memory controller 1160 that drives an external storage device, a media processor 1170 that processes data processed by the processor 1100 and input from an external input device and outputs the processed data to an external interface device, and the like. In addition, the processor 1100 may further include a plurality of modules and devices. In this case, the plurality of added modules may exchange data with the core 1110 and the cache memory 1120 through the bus interface 1130.

Here, the embedded memory 1140 may include a non-volatile memory as well as a volatile memory. The volatile memory may include a dynamic random access memory (DRAM), a mobile DRAM, a static random access memory (SRAM), a memory performing a function similar to that of these, and the like. The non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), a memory performing a function similar to that of these, and the like.

The communication module 1150 may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

The memory controller 1160 is for processing and managing data transmitted between the processor 1100 and an external storage device operating according to a different communication standard. The memory controller 1160 may include various memory controllers, for example, a controller that controls integrated device electronics (IDE), serial advanced technology attachment (SATA), a small computer system interface (SCSI), redundant array of independent disks (RAID), a solid state drive (SSD), external SATA (eSATA), personal computer memory card international association (PCMCIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), a compact flash (CF) card, and the like.

The media processor 1170 may process data processed by the processor 1100 and data input as an image, a voice, and other formats from an external input device, and may output the data to an external interface device. The media processor 1170 may include a graphics processing unit (GPU), a digital signal processor (DSP), high-definition audio (HD Audio), high-definition multimedia interface (HDMI) controller, and the like.

Figure 8:
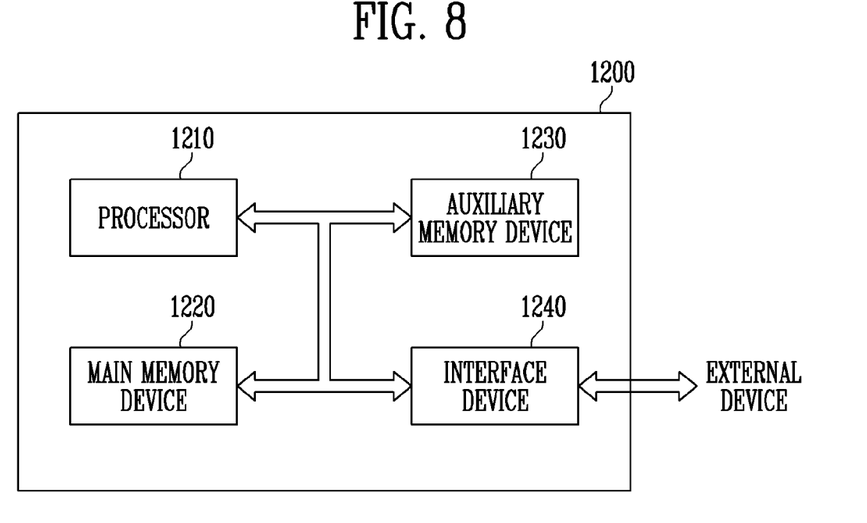
FIG. 8 is an example of a configuration diagram of a system implementing a memory device according to an embodiment of the present disclosure.

FIG. 8 is an example of a configuration diagram of a system implementing a memory device according to an embodiment of the present disclosure.

Referring to FIG. 8, the system 1200 is a device that processes data, and may perform input, process, output, communication, storage, and the like in order to perform a series of operations on data. The system 1200 may include a processor 1210, a main memory device 1220, an auxiliary memory device 1230, an interface device 1240, and the like. The system 1200 of the present embodiment may be various electronic systems operating using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual system, a smart television, or the like.

The processor 1210 may control processes of analysis of an input command, an operation, comparison, and the like of data stored in the system 1200, and may be substantially the same as the microprocessor 1000 or processor 1100 described above.

The main memory device 1220 may be a memory space capable of moving, storing, and executing a program code or data from the auxiliary memory device 1230 when the program is executed. A stored content may be preserved even though power is shut off. The auxiliary memory device 1230 refers to a memory device for storing a program code or data. The auxiliary memory device 1230 is slower than the main memory device 1220 but may store a lot of data. The main memory device 1220 or the auxiliary memory device 1230 may include one or more embodiments of the electronic device described above. For example, the main memory device 1220 or the auxiliary memory device 1230 may include one or more memory elements. The memory element may include first row lines extending in a first direction, column lines extending in a second direction crossing the first direction, second row lines extending in the first direction, first memory cells respectively connected between the first row lines and the column lines and including a first variable resistance layer and a first dielectric layer positioned between the first variable resistance layer and the first row line, and second memory cells respectively connected between the second row lines and the column lines and including a second variable resistance layer and a second dielectric layer positioned between the second variable resistance layer and the second row line. Therefore, reliability of the main memory device 1220 or the auxiliary memory device 1230 may be improved and a manufacturing process may be improved. As a result, an operation characteristic of the system 1200 may be improved.

Figure 9:
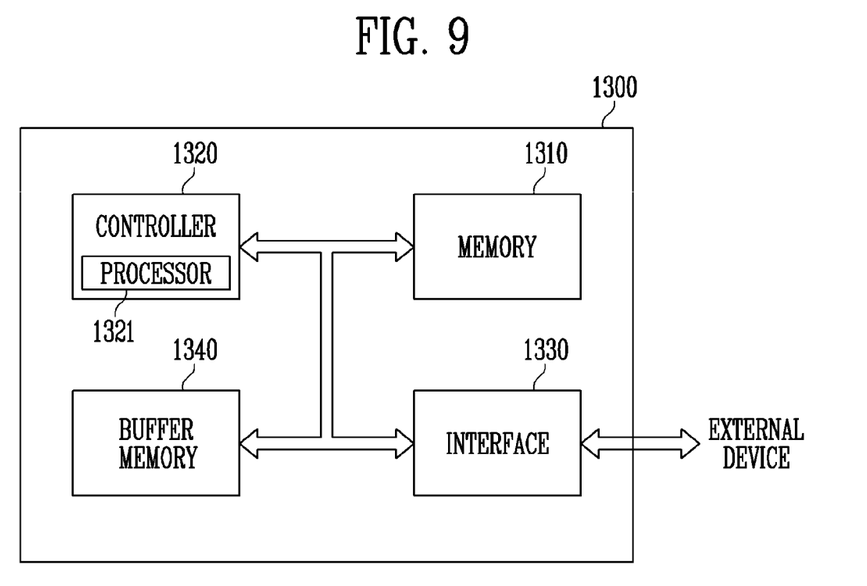
FIG. 9 is an example of a configuration diagram of a memory system implementing a memory device according to an embodiment of the present disclosure.

In addition, the main memory device 1220 or the auxiliary memory device 1230 may include a memory system 1300 as shown in FIG. 9 in addition to the semiconductor device of the above-described embodiment or without the semiconductor device of the above-described embodiment.

The interface device 1240 may be for exchanging an instruction, data, and the like between the system 1200 of the present embodiment and an external device. The interface device 1240 may be a keypad, a keyboard, a mouse, a speaker, a microphone, a display, various human interface devices (HIDs), a communication device, and the like. The communication device may be substantially the same as the communication module 1150 described above.

FIG. 9 is an example of a configuration diagram of a memory system implementing a memory device according to an embodiment of the present disclosure.

Referring to FIG. 9, the memory system 1300 may include a memory 1310 having a nonvolatile characteristic as a configuration for storing data, a controller 1320 for controlling the memory 1310, an interface 1330 for connection with an external device, and a buffer memory 1340 for temporarily storing data in order to efficiently transfer input/output of data between the interface 1330 and the memory 1310. The memory system 1300 may mean a memory for simply storing data, and further, may mean a data storage device that conserves stored data for a long time. The memory system 1300 may be a disk type such as a solid state drive (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The memory 1310 or the buffer memory 1340 may include one or more embodiments of the semiconductor device described above. For example, the memory 1310 or the buffer memory 1340 may include one or more memory elements. The memory element may include first row lines extending in a first direction, column lines extending in a second direction crossing the first direction, second row lines extending in the first direction, first memory cells respectively connected between the first row lines and the column lines and including a first variable resistance layer and a first dielectric layer positioned between the first variable resistance layer and the first row line, and second memory cells respectively connected between the second row lines and the column lines and including a second variable resistance layer and a second dielectric layer positioned between the second variable resistance layer and the second row line. Therefore, reliability of the memory 1310 or the buffer memory 1340 may be improved and a manufacturing process may be improved. As a result, an operation characteristic of the memory system 1300 may be improved.

The memory 1310 or the buffer memory 1340 may include various volatile or nonvolatile memories in addition to the semiconductor device of the above-described embodiment or without the semiconductor device of the above-described embodiment.

The controller 1320 may control exchange of data between the memory 1310 and the interface 1330. To this end, the controller 1320 may include a processor 1321 that performs an operation or the like for processing commands input through the interface 1330 from the outside of the memory system 1300.

The interface 1330 is for exchanging an instruction, data, and the like between the memory system 1300 and an external device. When the memory system 1300 is a card type or a disk type, the interface 1330 may be compatible with interfaces used in such a card type or disk type device, or may be compatible with interfaces used in a device similar to the card type or disk type device. The interface 1330 may be compatible with one or more interfaces having different types.

In accordance with the semiconductor device according to embodiments of the present disclosure described above, an operation characteristic and reliability of a memory cell may be improved.

What is claimed is:

1. A semiconductor device, comprising:
   first row lines each extending in a first direction;
   column lines each extending in a second direction crossing the first direction;
   second row lines each extending in the first direction;
   a plurality of first memory cells respectively coupled between the first row lines and the column lines, each of the plurality of first memory cells including a first variable resistance layer and a first electrode positioned between the first variable resistance layer and a corresponding one of the first row lines; and
   a plurality of second memory cells respectively coupled between the second row lines and the column lines, each of the plurality of second memory cells including a second variable resistance layer and a second electrode positioned between the second variable resistance layer and a corresponding one of the second row lines,
   wherein the first electrode, or the second electrode, or both include a first portion and a second portion, the second portion having a nitrogen concentration higher than that of the first portion and being disposed between the first portion and a corresponding one of the first and second variable resistance layers.

2. The semiconductor device of claim 1, wherein the first variable resistance layer, or the second variable resistance layer, or both maintain an amorphous state during a program operation.

3. The semiconductor device of claim 1, wherein each of the plurality of first memory cells, or each of the plurality of second memory cells, or both have an asymmetric structure by including the second portion.

4. The semiconductor device of claim 1, wherein a first program pulse of a first polarity is applied to a first memory cell selected from the plurality of first memory cells during a set operation, and a second program pulse of a second polarity different from the first polarity is applied to the first memory cell selected from the plurality of first memory cells during a reset operation.

5. The semiconductor device of claim 4, wherein the first memory cell to which the first program pulse of the first polarity is applied has a first threshold voltage, and the first memory cell to which the second program pulse of the second polarity is applied has a second threshold voltage different from the first threshold voltage.

6. The semiconductor device of claim 1, wherein a first program pulse of a first polarity is applied to a second memory cell selected from the plurality of second memory cells during a reset operation, and a second program pulse of a second polarity different from the first polarity is applied to the second memory cell selected from the plurality of second memory cells during a set operation.

7. The semiconductor device of claim 1, wherein a first program pulse of a first polarity is applied during a set operation of each of the plurality of first memory cells, and a second program pulse of a second polarity different from the first polarity is applied during a set operation of each of the plurality of second memory cells.

8. The semiconductor device of claim 1, wherein a first program pulse of a first polarity is applied in a reset operation of each of the plurality of second memory cells, and a second program pulse of a second polarity different from the first polarity is applied in a reset operation of each of the plurality of first memory cells.

9. The semiconductor device of claim 1, wherein a first read pulse of a first polarity is applied during a read operation of each of the plurality of first memory cells, and a second read pulse of a second polarity different from the first polarity is applied during a read operation of each of the plurality of second memory cells.

10. A semiconductor device comprising:
  a first memory deck comprising a plurality of first memory cells respectively coupled between first row lines and column lines crossing the first row lines, each of the plurality of first memory cells including a first variable resistance layer; and
  a second memory deck comprising a plurality of second memory cells respectively coupled between the column lines and second row lines crossing the column lines, each of the plurality of second memory cells including a second variable resistance layer,
  wherein a first read pulse of a first polarity is applied during a read operation of each of the plurality of first memory cells, and a second read pulse of a second polarity different from the first polarity is applied during a read operation of each of the plurality of second memory cells, and
  wherein a first program pulse of the first polarity is applied during a set operation of each of the plurality of first memory cells, a second program pulse of the second polarity different from the first polarity is applied during a reset operation of each of the plurality of first memory cells, the second program pulse of the second polarity is applied during a set operation of each of the plurality of second memory cells, and the first program pulse of the first polarity is applied during a reset operation of each of the plurality of second memory cells.

11. The semiconductor device of claim 10, wherein each of the plurality of first memory cells further includes a first dielectric layer positioned between the first variable resistance layer and a corresponding one of the first row lines.

12. The semiconductor device of claim 11, wherein each of the plurality of second memory cells further includes a second dielectric layer positioned between the second variable resistance layer and a corresponding one of the second row lines.

13. The semiconductor device of claim 11, wherein the first dielectric layer has a thickness of 1 to 20 Å.

14. The semiconductor device of claim 10, wherein each of the plurality of first memory cells further includes a first electrode positioned between the first variable resistance layer and a corresponding one of the first row lines, and the first electrode includes a first portion adjacent to the corresponding one of the first row lines and a second portion adjacent to the first variable resistance layer, the second portion having a nitrogen concentration higher than that of the first portion.

15. The semiconductor device of claim 10, wherein each of the plurality of second memory cells further includes a first electrode positioned between the second variable resistance layer and a corresponding one of the second row lines, and the first electrode includes a first portion adjacent to the corresponding one of the second row lines and a second portion adjacent to the second variable resistance layer, the second portion having a nitrogen concentration higher than that of the first portion.

16. The semiconductor device of claim 10, wherein each of the plurality of first memory cells, each of the plurality of second memory cells, or both are programmed to at least two states according to a threshold voltage.

* * * * *